(12) United States Patent
You

(10) Patent No.: US 6,342,276 B1
(45) Date of Patent: Jan. 29, 2002

(54) METHOD FOR MAKING A FIELD EMISSION DISPLAY

(75) Inventor: Jong-Hun You, Suwon-si (KR)

(73) Assignee: Samsung SDI Co., Ltd., Kyungki-Do (KR)

( * ) Notice: Subject to any disclaimer, the term of this patent is extended or adjusted under 35 U.S.C. 154(b) by 28 days.

(21) Appl. No.: 09/607,188

(22) Filed: Jun. 29, 2000

(30) Foreign Application Priority Data

Dec. 10, 1999 (KR) .............................. 99-56716

(51) Int. Cl.$^7$ ................................ B05D 3/00
(52) U.S. Cl. .................... 427/555; 101/114; 427/77; 427/122; 427/123; 427/126.3; 427/261; 427/264; 427/265; 427/270; 427/271; 427/367; 427/372.2; 427/380; 427/383.1; 427/404; 427/419.2; 427/557

(58) Field of Search ................................ 427/555, 557, 427/77, 122, 123, 126.3, 261, 264, 265, 270, 271, 367, 372.2, 380, 383.1, 404, 419.2; 101/114

Primary Examiner—Bernard Pianalto
(74) Attorney, Agent, or Firm—Christie, Parker & Hale, LLP

(57) ABSTRACT

A very fine pixel pattern can be formed by first screen printing a conductive paste and electron-emitting carbon paste material in sequence before removing a predetermined portion of the screen-printed layers simultaneously such that remaining portions become a fine pixel pattern. This method not only enables fine pixel pattern formation but also provides an electrode/emitter structure that increases electron emission. Furthermore all these improvements can be made with less manufacturing time and cost.

18 Claims, 5 Drawing Sheets

METHOD FOR MAKING A FIELD EMISSION DISPLAY

FIELD OF THE INVENTION

The present invention relates to a field emission display and in particular to a method of forming a fine electrode pattern of field emitting material on a substrate of such a display.

BACKGROUND OF THE INVENTION

As shown FIG. 1, a conventional field emission display is comprised of a rear substrate 12, a plurality of parallel cathode electrode lines 16 formed on the rear substrate 12, thin films 20 of electron-emitting material formed on the cathode electrodes 16, a front substrate 14 spaced apart from the rear substrate 12 and a plurality of parallel anode electrode lines 18 formed on the undersurface of the front substrate 14. Further for a color display an RGB phosphor layer 22 is formed on top of the anode electrodes 18. When a predetermined voltage applied between a selected anode electrode 18 and a selected cathode 16 electrical current flows in parallel with the film 20. Then electrons are emitted from the surface of the emitter film 20 and accelerated toward the front substrate 14 and collide with the phosphor layer 22 to cause emission of visible light.

As electron emitting material diamond-like carbon, carbon fiber or carbon nanotube are commonly used. And a transparent ITO is generally used as material for cathode electrodes.

A pattern of emitter may be formed by either photolithography or printing. The first method involves forming a thin film of emitter and wet etching to form a desired pattern. According to the second method a carbon material is made in paste and coated on cathode electrodes by a thick film technique such as printing. However, a fine pattern of emitter may be possible with the first method but it requires costly and complex process. The latter is relatively less costly but it is difficult to produce a fine pattern of less than 100 micron because of distances between pixels in a mesh used in a thick film technique.

SUMMARY OF THE INVENTION

It is an objective of the present invention to provide a solution to a problem mentioned above. Namely, a method that enables forming of a fine emitter pattern and yet having improved emission efficiency.

DETAILED DESCRIPTION OF THE PRESENT INVENTION

Figure 1:
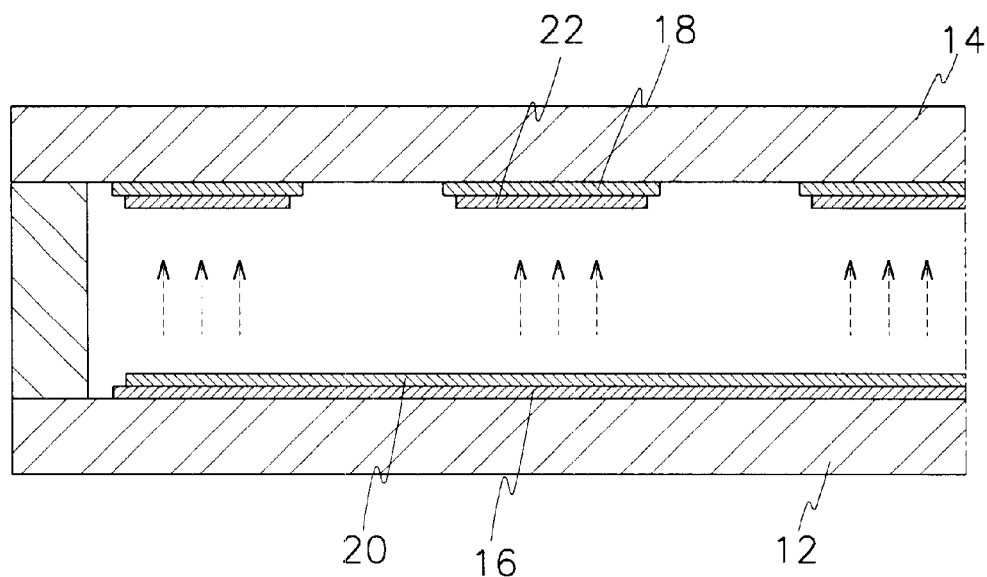
FIG. 1 is a cross section of a conventional surface conductive FED.
Figure 2:
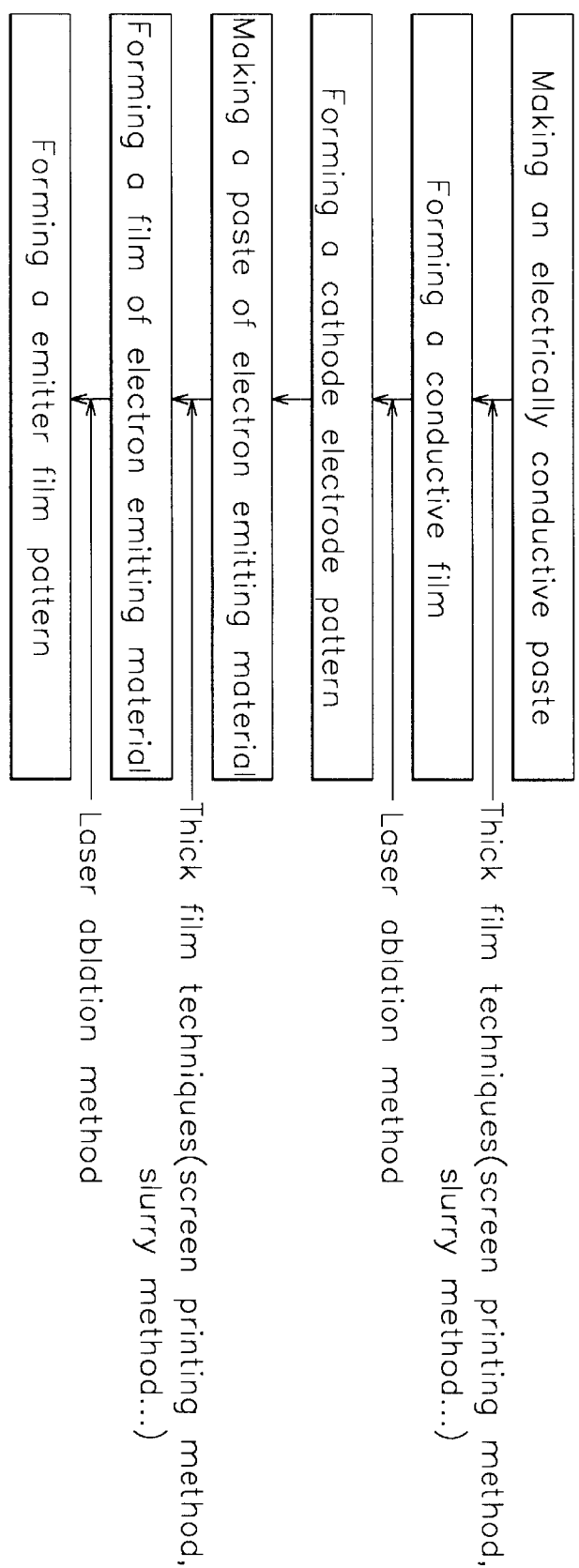
FIG. 2 is a flow chart according to the present invention.

Referring to FIG. 2 showing a flow chart for forming a pattern of a field emission film according to the present invention. Each step of the chart will be explained with reference to FIGS. 3A, 3B, 3C and 3D. First an electrically conductive paste is made of material having a high enough viscosity for screen printing such as ITO or Al or Cr. In case the paste is of ITO it is preferred to include some solid components at a certain percentage. Specifically for a paste of 10,000~100,000 cps viscosity the solid components are preferably between 10~80 w % of the paste.

Figure 3A:
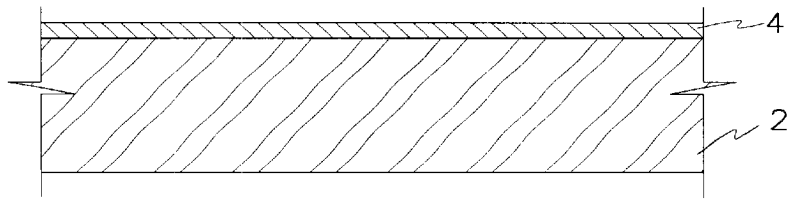
FIGS. 3A, 3B, 3C and 3D shows steps of forming electrodes/emitters corresponding to the flow chart in FIG. 2.
Figure 3B:
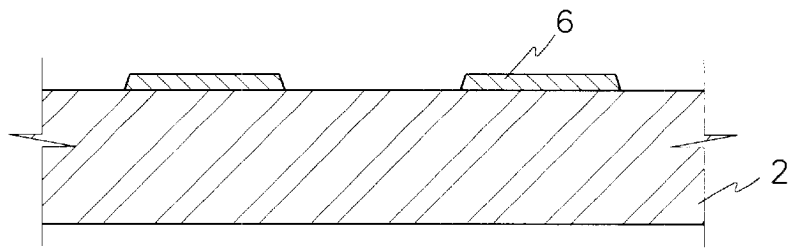
Figure 3C:
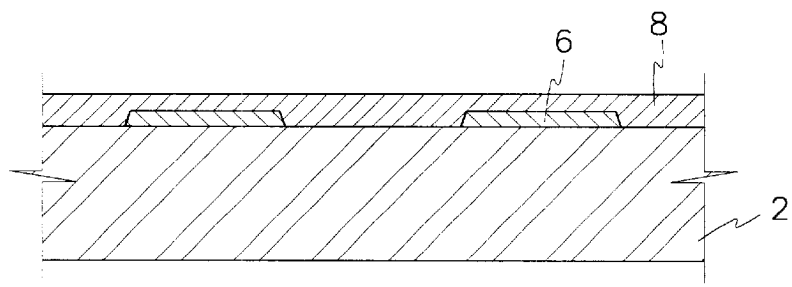
Figure 3D:
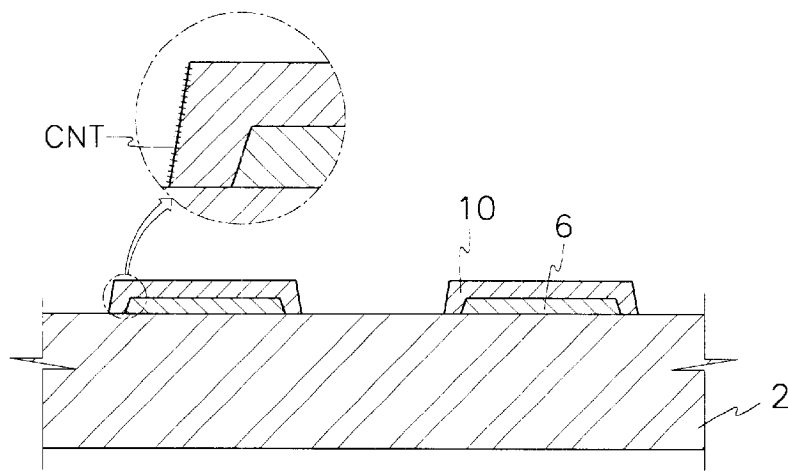

Thus prepared paste is layered on a surface of a substrate by a thick film techniques such as the screen printing or slurry method to form a conductive film 4 as shown in FIG. 3A. The screen printing involves transferring a paste onto a substrate through a screen mesh by a roller or squeeze. This method is commonly used for other printing needs. Next using a laser ablation, cathode electrode pattern 6 is formed. Namely a predetermined portion of the film is removed by laser irradiation leaving a desired cathode electrode pattern as shown in FIG. 3B. Now a paste made of graphite or carbon nanotube which have a high energy absorption rate in response to laser radiation is coated on the entire substrate over the cathode electrode pattern by screen printing and hardened as shown in FIG. 3C. Here the paste is preferably composed of one of the above electron-emitting material, glass powder and silver and binder at a ratio of 1:0.5~0.8:0.5~0.8:2-20. The laser ablation is once more irradiated in a predetermined pattern such that irradiated areas absorb high energy instantly and becomes gaseous leaving the emitter film over and slightly beyond the cathodes as shown in FIG. 3D. Among the electron emitting materials carbon nanotubes is preferred because they are exposured on the surface after laser irradiation as indicated in an enlarged circle in FIG. 3d and electron-emitting characteristic is greatly increased. As to the laser, an infrared (IR) laser is preferred because of high absorption into carbon family material used in the present invention. Specifically laser beam has a wavelength of 562–1024 nm may be used for patterning emitters including carbon nanotube.

Figure 4:
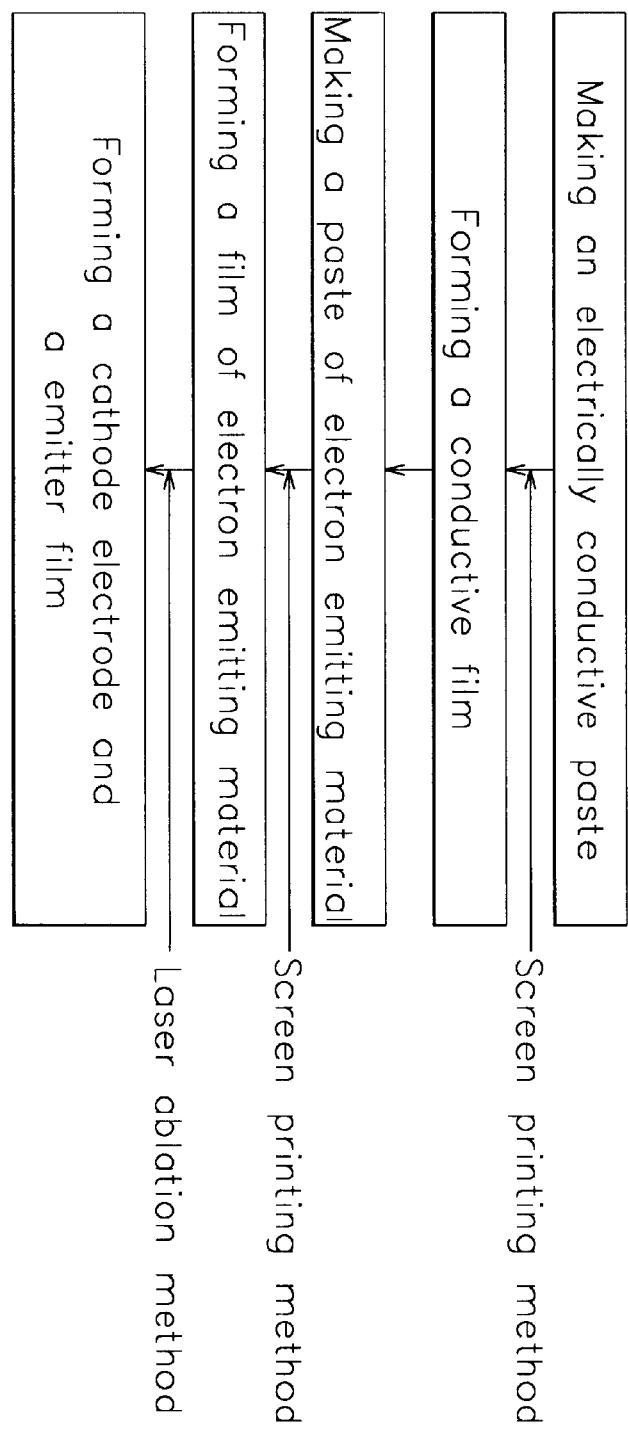
FIG. 4 is a flow chart according to the present invention.

FIG. 4 shows a flow chart for forming a pattern of field emitter according to a second embodiment of the present invention. The second embodiment does not perform laser ablation right after a film of conductive paste is formed on the substrate. Rather, only after an electron-emitting thin film has been formed over the conductive layer a laser beam is irradiated in a predetermined pattern and with an intensity such that the irradiated predetermined portions of both the conductive film and electron emitter film are removed simultaneously.

Figure 5A:
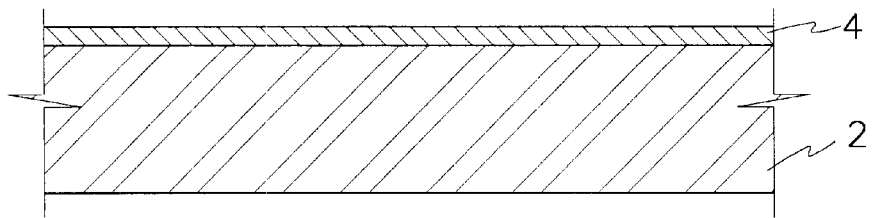
FIGS. 5A, 5B and 5C shows steps of forming electrodes/emitters corresponding to the flow chart in FIG. 4.
Figure 5B:
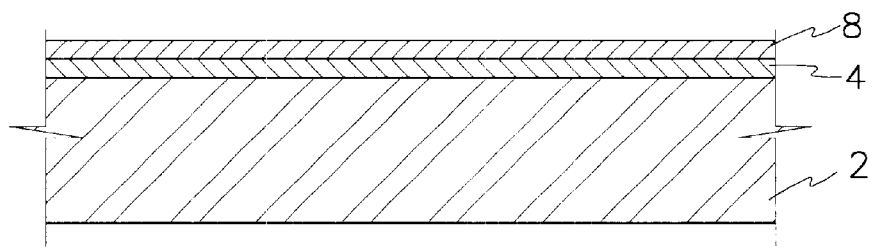
Figure 5C:
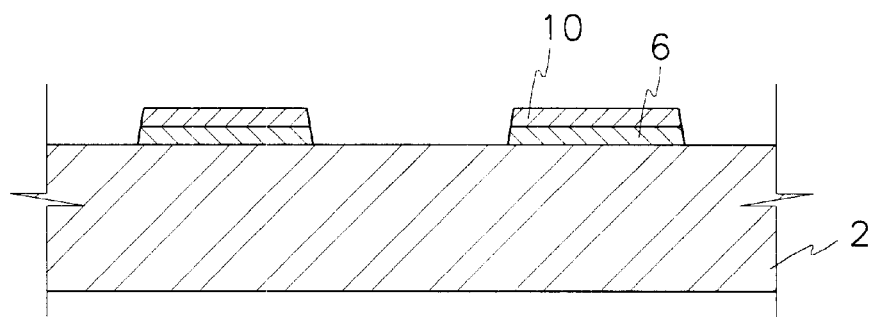

To be more specific a conductive film 4 made of ITO is first formed on the entire surface of a substrate 2 as shown in FIG. 5A. A film of emitter material 8 is further formed over the conductive film 4, as shown in FIG. 5B, by screen printing. Only then a laser is irradiated at a predetermined portions of the film so that a predetermined pattern of the emitter and conductive film remain. Here the energy density of the laser beam is controlled to instantly heat portions of the two layers at the same time and to turn them gaseous into a predetermined depth. As in the case of the first embodiment a laser beam of 562–1024 nm is preferably used. In response to the laser radiation the carbon nanotubes are exposured on the surface the patterned emitters as shown in FIG. 3D.

What is claimed is:

1. A method for making an FED comprising steps of forming a conductive film made of electrically conductive material on a substrate, irradiating laser beam on said conductive film in a predetermined pattern such that irradiated portions are removed leaving a cathode electrode pattern, forming a film of electron emitting material on said substrate covering said cathode electrodes, removing a predetermined portion of said film of electron emitting by laser irradiation.

2. A method for making an FED according to claim 1, wherein said electron emitting material includes graphite.

3. A method for making an FED according to claim 1, wherein said electron emitting material includes carbon nanotube.

4. A method for making an FED according to claim 1, wherein said laser beam has a wavelength in the range of 562–1024 nm.

5. A method for making an FED according to claim 1, wherein said laser beam is generated by an infrared laser.

6. A method for making an FED according to claim 1, wherein said conductive material is indium tin oxide.

7. A method for making an FED according to claim 1, wherein said conductive material is metal.

8. A method for making an FED according to claim 7, wherein said metal includes aluminum or chrome.

9. A method for making an FED according to claim 1, wherein said conductive film and said film of electron emitting material are formed by slurry of screen printing.

10. A method for making an FED comprising steps of forming a conductive film made of electrically conductive material on a substrate, forming a film of carbon electron emitting material on said conductive film, irradiating laser beam of predetermined intensity on said film of electron emitting material in a predetermined pattern such that a predetermined portion of said conductive film and said film of carbon material are removed at the same time.

11. A method for making an FED according to claim 10, wherein said electron emitting material includes graphite.

12. A method for making an FED according to claim 10, wherein said electron emitting material includes carbon nanotube.

13. A method for making an FED according to claim 10, wherein said laser beam has a wavelength in the range of 562–1024 nm.

14. A method for making an FED according to claim 10, wherein said laser beam is generated by an infrared laser.

15. A method for making an FED according to claim 10, wherein said conductive material is indium tin oxide.

16. A method for making an FED according to claim 10, wherein said conductive material is metal.

17. A method for making an FED according to claim 16, wherein said metal includes aluminum or chrome.

18. A method for making an FED according to claim 10, wherein said conductive film and said film of electron emitting material are formed by slurry of screen printing.

* * * * *